(12) United States Patent
Chiang et al.

(10) Patent No.: US 11,237,189 B2
(45) Date of Patent: Feb. 1, 2022

(54) DETECTION DEVICE AND MANUFACTURING METHOD THEREOF

(71) Applicant: Siliconware Precision Industries Co., Ltd., Taichung (TW)

(72) Inventors: Kuo-Tung Chiang, Taichung (TW); Cheng-Kun Lee, Taichung (TW); Jin-Rong Guo, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 36 days.

(21) Appl. No.: 16/534,789

(22) Filed: Aug. 7, 2019

(65) Prior Publication Data
US 2020/0309820 A1    Oct. 1, 2020

(30) Foreign Application Priority Data

Mar. 29, 2019 (TW) ................................. 108111258

(51) Int. Cl.
*G01R 1/073* (2006.01)

(52) U.S. Cl.
CPC ................................ *G01R 1/07342* (2013.01)

(58) Field of Classification Search
CPC .............. G01R 1/07342; G01R 1/0483; G01R 1/07314; G01R 1/07371; G01R 1/06722; G01R 1/06772; G01R 1/0466; G01R 1/07357; G01R 3/00; G01R 1/0458; G01R 1/06711; G01R 1/06761; G01R 1/07378; G01R 31/2874; G01R 1/06744; G01R 1/0433; G01R 1/0416; H01R 12/52; H01R 13/2421
See application file for complete search history.

(56) References Cited

U.S. PATENT DOCUMENTS

| | | | | |
|---|---|---|---|---|
| 7,950,927 | B2* | 5/2011 | Kazama | G01R 3/00 439/66 |
| 2004/0212381 | A1* | 10/2004 | Yoshida | G01R 1/06722 324/755.02 |
| 2005/0258843 | A1* | 11/2005 | Kazama | G01R 1/06722 324/756.03 |
| 2006/0066330 | A1* | 3/2006 | Yoshida | G01R 1/07314 324/756.03 |
| 2006/0066331 | A1* | 3/2006 | Yoshida | G01R 1/07314 324/756.03 |
| 2007/0111560 | A1* | 5/2007 | Kazama | G01R 1/0483 439/71 |

* cited by examiner

*Primary Examiner* — Lee E Rodak
(74) *Attorney, Agent, or Firm* — Mintz Levin Cohn Ferris Glovsky and Popeo, P.C.; Peter F. Corless; Steven M. Jensen (57) ABSTRACT

A detection device includes: a metal body having a plurality of main vias, a plurality of main through holes with insulators formed on the hole walls of the main vias, and a plurality of connecting elements disposed in the main through holes. Therefore, when testing a chip with I/O pins of high density with the detection device, the connecting elements contact the insulator only, without contacting the hole walls of the main vias, and the problem of short circuits can be avoided. A method of forming a detection device is also provided.

16 Claims, 7 Drawing Sheets

DETECTION DEVICE AND MANUFACTURING METHOD THEREOF

CROSS-REFERENCE TO RELATED APPLICATIONS

This application claims priority to Taiwanese Application Serial No. 108111258, filed on Mar. 29, 2019. The entirety of the application is hereby incorporated by reference herein and made a part of this specification.

BACKGROUND

1. Technical Field

The present disclosure relates to detection devices, and, more particularly, to a detection device having a probe-typed pin and a method for fabricating the detection device.

2. Description of the Prior Art

In the prior art, a detection device, such as a probe card structure, is not applicable to measuring a circuit having a high frequency bandwidth due to the design of its pins. Besides, the probe card is too big for measuring a micro-circuit. In other words, a packaged probe card structure is not applicable to measuring a small circuit.

Since a modern electronic product is required to have more and more functions and be smaller and smaller, the I/O pins of a single chip have to be closer and closer.

In the detection device according to the prior art, the probes penetrate and are disposed in metal holes. For a detection device having densely arranged pins, the probes are likely in contact with and short-circuit to the metal holes, which degrades the detection quality.

Therefore, how to solve the problems of the prior art is becoming an urgent issue in the art.

SUMMARY

In view of the problems of the prior art, the present disclosure provides a detection device, comprising: a body having a base, a covering member stacked on the base, a first side, a second side opposing the first side, and a plurality of main vias being in communication with the first side and the second side and penetrating the base and the covering member, each of the main vias having a flat straight hole wall; a plurality of insulators formed on the flat straight hole walls of the main vias and free from filling the main vias completely with a plurality of main through holes formed in the body, each of the main through holes having an active region being in communication with the first side and/or the second side and disposed on the base and/or the covering member, each of the main through holes having a step-shaped hole wall at the active region; and a plurality of connecting elements disposed in the main through holes and exposed from the first side and/or the second side of the body, wherein the active region is wider than the connecting elements.

The present disclosure further provides a method for fabricating a detection device, comprising: providing a body having a first side, a second side opposing the first side, and a plurality of main vias being in communication with the first side and the second side, each of the main vias having a flat straight hole wall; filling in the main vias an insulation material; forming in the insulation material a plurality of main through holes to form a plurality of insulators that are on the flat straight hole walls of the main vias, free from filling the main vias completely and composed of the insulation material, each of the main through holes having an active region being in communication with the first side and/or the second side of the body, each of the main through holes having a step-shaped hole wall at the active region; and disposing in the main through holes a plurality of connecting elements that are exposed from the first side and/or the second side of the body.

In an embodiment, the method further comprises: providing a base having a first via and a covering member having a second via; filling the insulation material in the first via and the second via; forming a first through hole in the insulation material of the first via to form a first insulation part that is composed of the insulation material; forming a second through hole in the insulation material of the second via to form a second insulation part that is composed of the insulation material; and stacking the covering member on the base to form the body, communicating the first via with the second via to form the main vias, the main vias penetrating the base and the covering member, and connecting the first insulation part and the second insulation part to form the insulator. In an embodiment, the base and the covering member is formed by a conductive material. In another embodiment, the active region is deposited on the base and/or the covering member.

In an embodiment, the active region comprises a plurality of hole portions being in communication with one another, and the outermost one of the hole portions being in communication with the first side and/or the second side of the body is narrower than the others of the hole portions. In an embodiment, the plurality of hole portions are wider than the connecting elements.

In an embodiment, the main vias and the main through holes are coaxially disposed.

In an embodiment, the connecting elements are probes.

In an embodiment, the detection device further comprises a carrier for receiving the body.

It is known from the above that in the detection device and the method for fabricating the same according to the present disclosure, the insulator is formed on the hole walls of the main vias to form the main through holes, allowing the connecting elements to penetrate therethrough. As compared with the prior art, the detection device according to the present disclosure can detect a chip having I/O pins of a high density, and the connecting elements will be in contact with the insulator only, without contacting the hole walls of the main vias. Therefore, the short circuit problem is solved, the detection quality is improved, and the yield is increased.

BRIEF DESCRIPTION OF THE DRAWINGS

The disclosure can be more fully understood by reading the following detailed description of the embodiments, with reference made to the accompanying drawings, wherein:

FIGS. 3B', 3C' and 3D' are top views of FIGS. 3B, 3C and 3D, respectively;

FIGS. 4B', 4C' and 4D' are top views of FIGS. 4B, 4C and 4D, respectively;

FIG. 5C' is a top view of FIG. 5C.

DETAILED DESCRIPTION

The following illustrative embodiments are provided to illustrate the disclosure of the present disclosure. These and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. Numerous modifications and variations can be devised without departing from the spirit of the present disclosure. As used herein, the singular forms "a," "an," and "the" are intended to include the plural forms as well, unless the context clearly indicates otherwise. Changes or adjustments are considered to be within the scope of the present disclosure, without departing from the scope of the present disclosure.

Figure 1:
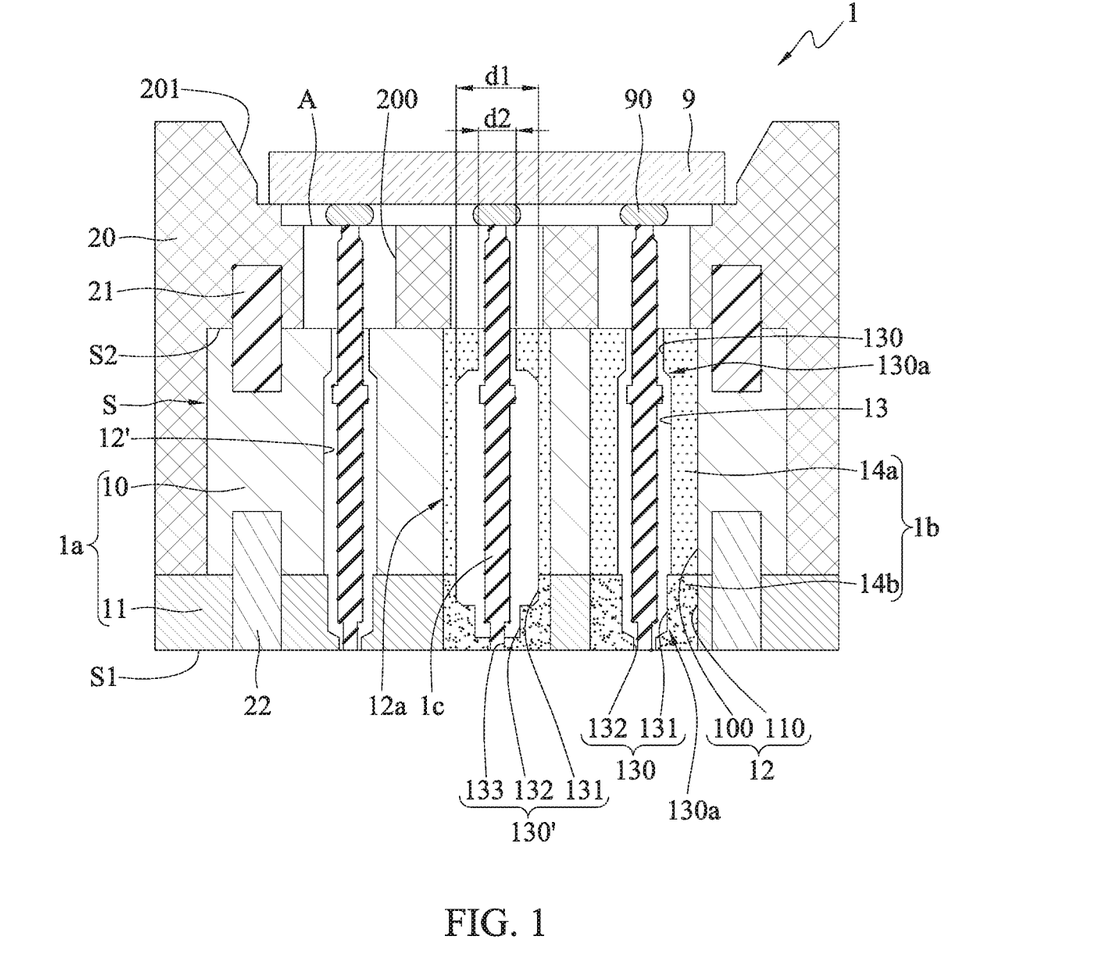
FIG. 1 is a cross-sectional view of a detection device according to the present disclosure.

FIG. 1 is a cross-sectional view of a detection device 1 according to the present disclosure. The detection device 1 comprises a body 1a, an insulator 1b and a plurality of connecting elements 1c.

The body 1a has a first side S1, a second side S2 opposing the first side S1, and main vias 12 in communication with the first side S1 and the second side S2. Each of the main vias 12 has a flat straight hole wall 12a.

The body 1a comprises a base 10 and a covering member 11 stacked on the base 10. The main vias 12 penetrate the base 10 and the covering member 11. The base 10 has first vias 100. The covering member 11 has second vias 110. The first vias 100 and the second vias 110 are in communication with each other to form the main vias 12.

In an embodiment, the base 10 is made of a conductive material, such as aluminum alloy. In another embodiment, the covering member 11 is made of a conductive material, such as aluminum alloy.

The insulator 1b is formed on the hole wall 12a of the main vias 12, without filling the main vias 12 completely, to form main through holes 13. Each of the main through holes 13 has an active region 130 in communication with the first side S1 and/or the second side S2, and a step-shaped hole wall 130a at the active region 130.

In an embodiment, the insulator 1b comprises a first insulation part 14a disposed in the first via 100 (or in the base 10) and a second insulation part 14b disposed in the second via 110 (or in the covering member 11).

The active region 130 can be disposed on the base 10 and/or the covering member 11 on demands. The number of steps of the active region 130 can vary on demands. In an embodiment, the active region 130 is single-step-shaped, and comprises a first hole portion 131 and a second hole portion 132 in communication with the first hole portion 131. The second hole portion 132 is the outermost one of the hole portions and is in communication with the first side S1 and/or the second side S2. The second hole portion 132 has a width d2 less than a width d1 of the first hole portion 131. In another embodiment, the active region 130' is in the shape of two steps, and comprises a first hole portion 131, a second hole portion 132 and a third hole portion 133 that are in communication in the same sequence. The third hole portion 133 is the outermost one of the hole portions and is in communication with the first side S1 and/or the second side S2. The third hole portion 133 is narrower than the second hole portion 132.

In an embodiment, the width of the other segments of the main through holes 13 are substantially equal to the maximum width of the active region 130, for example, being equal to the width d1 of the first hole portion 131.

In an embodiment, the main vias 12 and the main through holes 13 are coaxially disposed. In another embodiment, the main vias 12 and the active regions 130 and 130' are coaxially disposed.

The connecting elements 1c penetrate and are disposed in the main through holes 13, and are exposed from the first side S1 and the second side S2 of the body 1a. The width of each segment of the main through holes 13 (or the widths d1 and d2 of each of the hole portions of the active region 130) is greater than the width of the connecting elements 1c.

In an embodiment, the plurality of connecting elements 1c are metal probes, such as copper, and are divided into power pins, signal pins and grounding pins. In an embodiment, the body 1a is further provided with auxiliary vias 12' (no insulator is disposed in the auxiliary vias 12'), for the connecting elements 1c that are used as grounding pins to penetrate therethrough. The connecting elements 1c that are used as power pins and signals pins penetrate and are disposed in the main through holes 13.

The detection device 1 further comprises a carrier 20 having a receiving space S for the body 1a and/or the base 10 to be received therein.

In an embodiment, the carrier 20 is a metal stand, and has an anode insulation electroplating layer covering a surface thereof. The receiving space S is disposed under a bottom side of the carrier 20. A testing surface A is disposed on a top side of the carrier 20. The connecting elements 1c have one portion in the receiving space S, and the other portion exposed from the testing surface A. In an embodiment, the carrier 20 has at least one conductive hole 200 and a groove 201 disposed on the top side thereof, the conductive hole 200 is in communication with and is exposed from the groove 201, and the connecting elements 1c are exposed from the groove 201 through the conductive hole 200.

In an assembling process, a positioning member 21 (such as a bolt) positions the base 10 and the carrier 20, and a fixing member 22 (such as a screw) fixes the base 10 to the covering member 11.

When the detection device 1 is in use, an object 9 is disposed in the groove 201 and electrically connected to the connecting elements 1c, for a testing process to be performed.

In an embodiment, the object 9 is an electronic component, such as an active element, such as a semiconductor chip, a passive element, such as a resistor, a capacitor and an inductor, or a combination thereof. In another embodiment, the electronic component is in contact with and electrically connected to the connecting elements 1c through a plurality of conductive bumps 90, such as a solder material.

Figure 2:
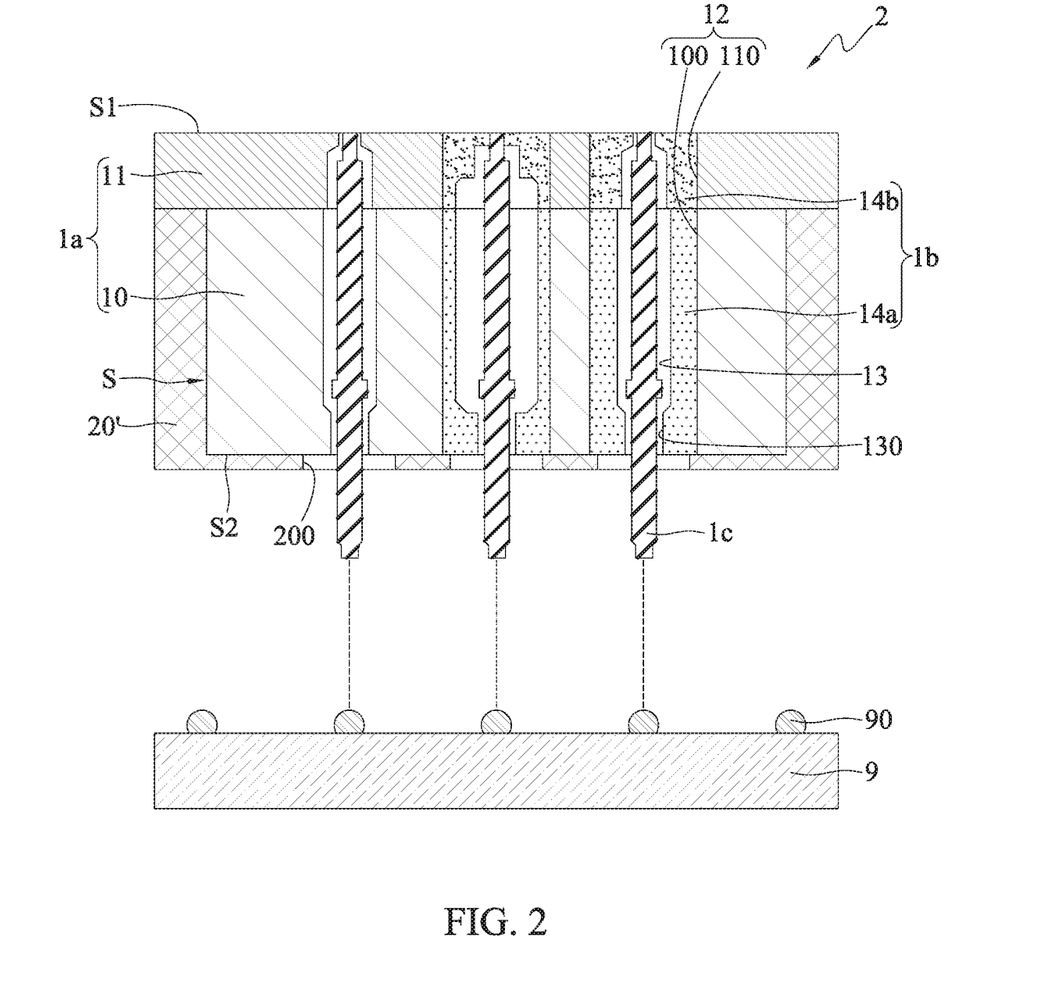
FIG. 2 is a schematic diagram of another embodiment of FIG. 1.

In an embodiment, such as a detection device 2 shown in FIG. 2, the carrier 20 does not have the groove 201, and the connecting elements 1c protrude from the carrier 20 through the conductive hole 200. When the detection device 2 is in use, the connecting elements 1c are faced down, the conductive bumps 90 of the object 9 are disposed on the second side S2 of the body 1a, and the object 9 is electrically connected to the connecting elements 1c, for the testing process to be performed.

FIGS. 3A to 3D are cross-sectional views illustrating a method for fabricating a detection device of a first embodiment according to the present disclosure.

Figure 3A:
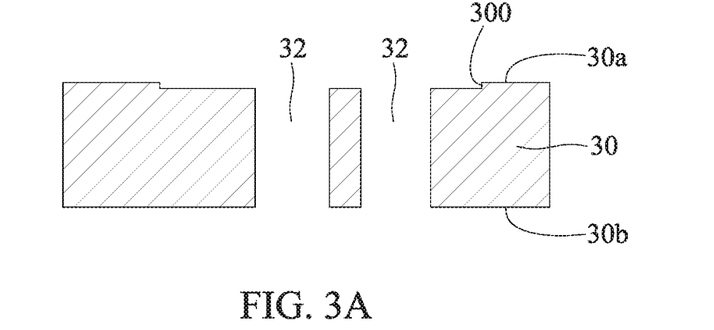
FIGS. 3A to 3D are cross-sectional views illustrating a method for fabricating a detection device of a first embodiment according to the present disclosure.

As shown in FIG. 3A, a conductive board 30 is provided and has a first surface 30a, a second surface 30b opposing the first surface 30b, and a plurality of vias 32 in communication with the first surface 30a and the second surface 30b.

In an embodiment, an aluminum alloy board is processed, anodized, and performed by a first hole forming process, to form the vias 32.

In an embodiment, an opening 300 is formed on the first surface 30a of the conductive board 30 and is in communication with the vias 32. In another embodiment, the opening 300 is rectangular.

Figure 3B:
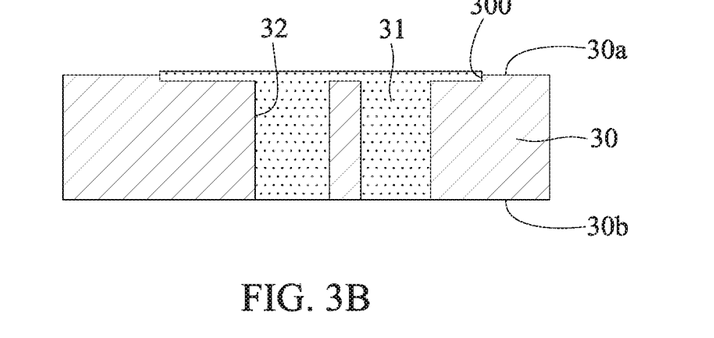

As shown in FIG. 3B, an insulation material 31 is filled in the vias 32 completely.

In an embodiment, a permanent hole plugging ink process is performed in a vacuum printing manner to form the insulation material 31, and the insulation material 31 is then baked and cured.

In an embodiment, the opening 300 can also be filled with the insulation material 31, as shown in FIG. 3B'.

Figure 3C:
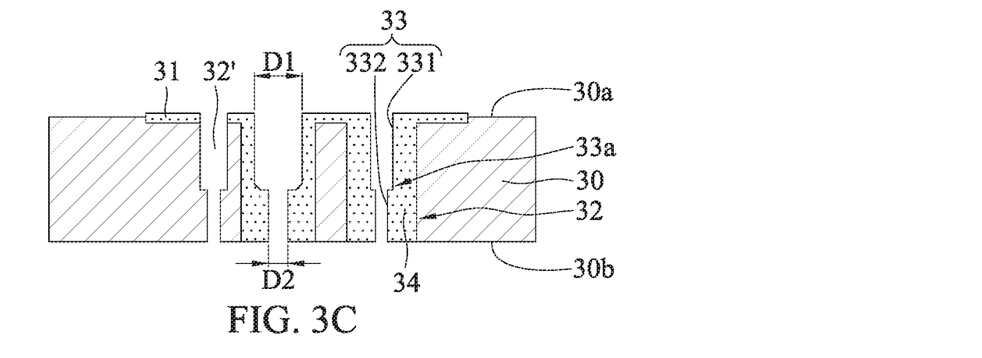

As shown in FIG. 3C, through holes 33 are formed in the insulation material 31. The insulation material 31 is formed on the hole walls of the vias 32, without filling the vias 32 completely, and constitutes the insulator 34.

In an embodiment, a two-time hole forming process is performed to form a plurality of hole portions having different widths in the through holes 33 to form a step-shaped hole wall 33a. In an embodiment, each of the through holes 33 comprise a first hole portion 331 that is in communication with the first surface 30a of the conductive board 30 and a second hole portion 332 that is in communication with the first hole portion 331 and the second surface 30b of the conductive board 30 and has a width D2 less than a width D1 of the first hole portion 331.

As shown in FIGS. 3C and 3C', auxiliary vias 32' are formed to penetrate the insulation material 31 disposed in the opening 300 and the conductive board 30, are in communication with the first surface 30a and the second surface 30b, and have a plurality of hole portions of different widths, to form a step-shaped hole wall.

The opening 300 prevents the insulation material 31 from rotating in the two-time hole forming process.

Figure 3D:
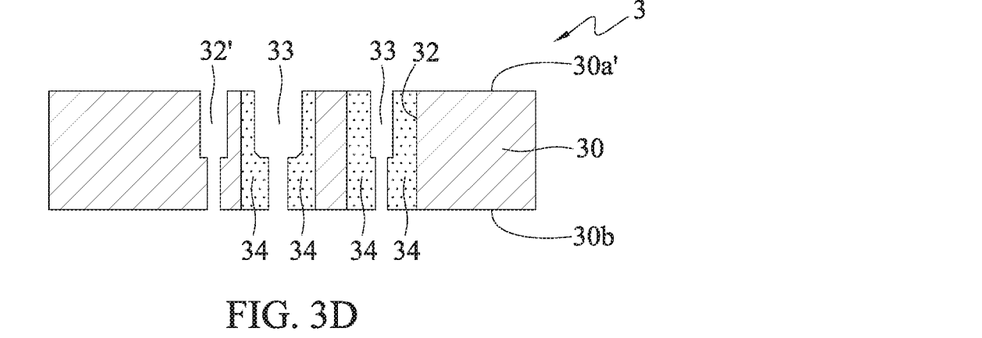

As shown in FIGS. 3D and 3D', the insulation material 31 in the opening 300 is removed, to form a base 3, which is used as the base 10 or the covering member 11. Then, the through holes 33 of two of the base 3 (one is used as the base 10, and the other is used as the covering member 11) are aligned and form the main through holes 13, to form the needed body 1a, for the connecting elements 1c to be disposed in the main through holes 13.

In an embodiment, a portion of the first surface 30a of the conductive board 30 and the insulation material 31 are removed by a leveling process, a grinding process or a cutting process, allowing two ends of each of the vias 32 (or the through holes 33) to be leveled with the first surface 30a' and the second surface 30b' that after the leveling process. In an embodiment, a portion of 0.2 mm thick is cut from the insulation material 31, and all the through holes 33 are performed by a bevel process to trim the hole edges.

The through holes 33 of the bases 3 are aligned in a manner that a larger hole facing a larger hole or the first surface 30a' being bonded to the first surface 30a'.

FIGS. 4A to 4D are cross-sectional views illustrating a method for fabricating a detection device of a second embodiment according to the present disclosure. The second embodiment differs from the first embodiment in that their openings have different shapes.

Figure 4A:
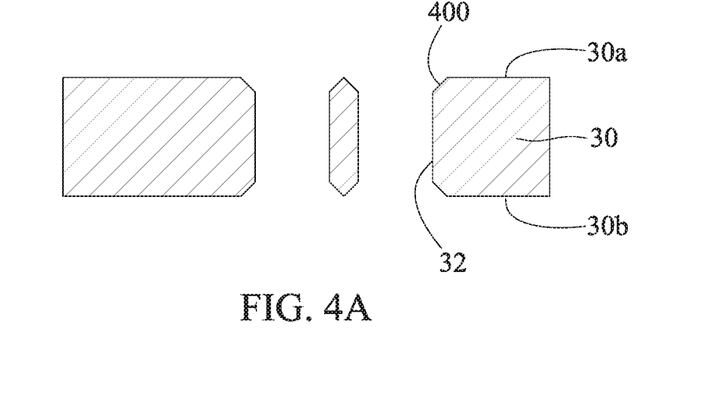
FIGS. 4A to 4D are cross-sectional views illustrating a method for fabricating a detection device of a second embodiment according to the present disclosure.

As shown in FIG. 4A, a conductive board 30 is provided that has a first surface 30a, a second surface 30b opposing the first surface 30a, and a plurality of vias 32 in communication with the first surface 30a and the second surface 30b.

In an embodiment, an opening 400 in communication with the vias 32 is formed on the first surface 30a of the conductive board 30 by a bevel process and is arc-shaped.

Figure 4B:
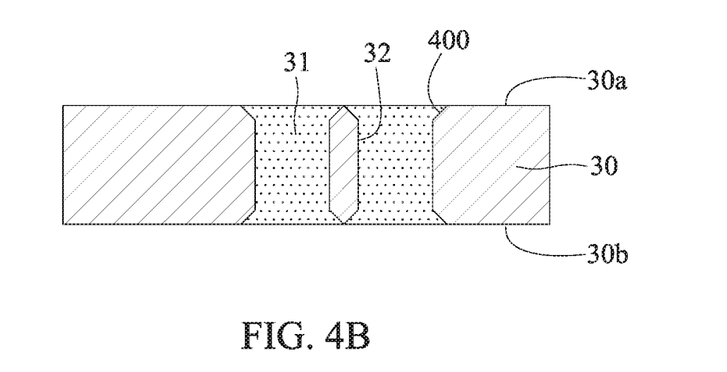

As shown in FIGS. 4B and 4B', an insulation material 31 is filled in the vias 32 completely. The insulation material 31 can also fill the opening 400 completely.

Figure 4C:
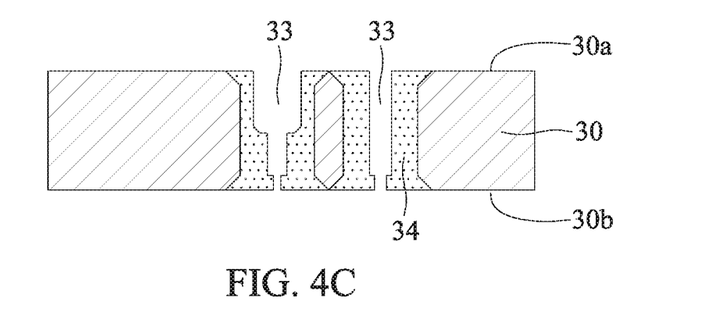

As shown in FIGS. 4C and 4C', through holes 33 are formed in the insulation material 31 to constitute the insulator 34. The bevel angle of the opening 400 can prevent the insulation material 31 from rotating and being fallen during the two-time hole forming process.

Figure 4D:
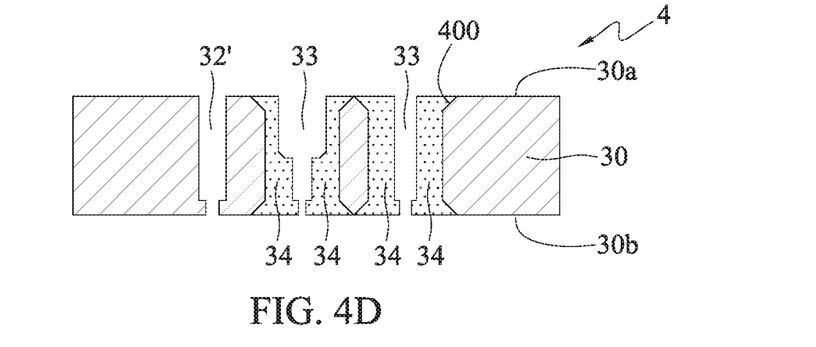

As shown in FIGS. 4D and 4D', a structure shown in FIG. 4C is performed by an anode electroplating process first, and then a grounding hole machining process is performed to form auxiliary vias 32' in communication with the first surface 30a and the second surface 30b. A base 4 is thus formed and used as the base 10 or the covering member 11. Then, the through holes 33 of two of the bases 4 (one is used as the base 10, and the other is used as the covering member 11) are aligned, to form the needed body 1a and the main through holes 13, for the connecting elements 1c to be disposed in the main through holes 13.

Figure 5A:
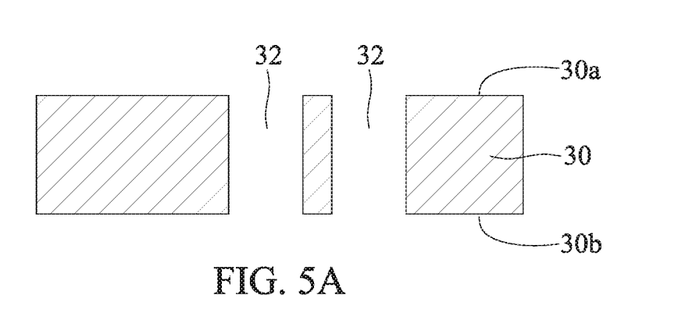
FIGS. 5A to 5C are cross-sectional views illustrating a method for fabricating a detection device of a third embodiment according to the present disclosure.
Figure 5B:
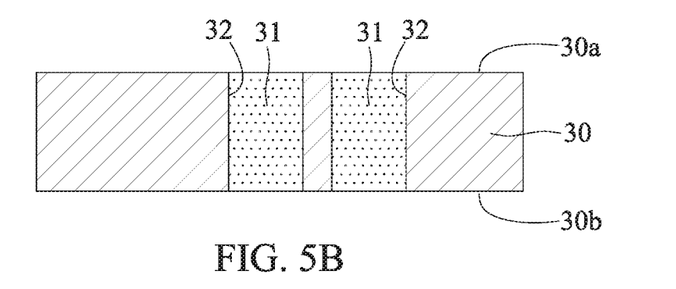
Figure 5C:
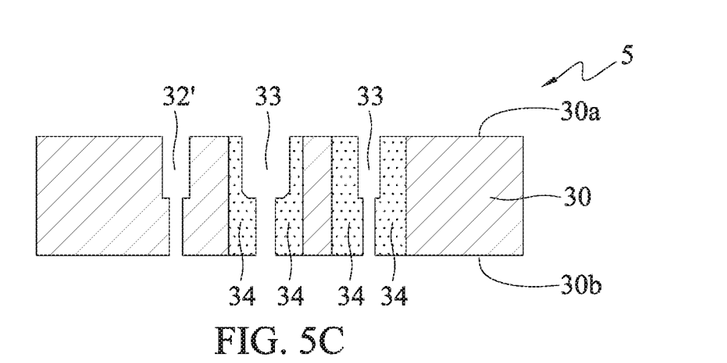

FIGS. 5A to 5C are cross-sectional views illustrating a method for fabricating a detection device of a third embodiment according to the present disclosure. The third embodiment differs from the first and second embodiments in that the opening is omitted.

As shown in FIG. 5A, a conductive board 30 is provided and has a first surface 30a, a second surface 30b opposing the first surface 30a, and a plurality of vias 32 in communication with the first surface 30a and the second surface 30b.

As shown in FIG. 5B, an insulation material 31 is filled in the vias 32 completely.

As shown in FIGS. 5C and 5C', through holes 33 are formed in the insulation material 31 and bonded to the hole walls of the vias 32, and the insulation material 31 does not fill the vias 32 completely and constitutes the insulator 34. The conductive board 30 are penetrated and auxiliary vias 32' in communication with the first surface 30a and the second surface 30b are formed. A base 5 is thus formed, and used as the base 10 or the covering member 11. Then, the through holes 33 of two of the bases 5 (one is used as the base 10, and the other is used as the covering member 11) are aligned, to form the needed body 1a and the main through holes 13, for the connecting elements 1c to be disposed in the main through holes 13.

It may be understood that the number and size of the hole portions of the through holes 33 can be designed on demands.

In the detection devices 1 and 2 and the method for fabricating the same according to the present disclosure, the insulator 1b is formed on the hole wall 12a of the main vias 12 to form the main through holes 13, for the connecting elements 1c to penetrate therethrough. As compared with the prior art, the detection devices 1 and 2 according to present disclosure can test an electronic component 9 having conductive bumps 90 arranged in a high density, and the connecting elements 1c are in contact with the insulator 1b (the insulation material 31) only, without contacting the hole wall 12a of the main vias 12 (such as, a metal material of the conductive board 30). Therefore, the short circuit problem is solved, and the detection quality is improved.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. A detection device, comprising:
   a body having a base, a covering member stacked on the base, a first side, a second side opposing the first side, and a plurality of main vias being in communication with the first side and the second side and penetrating the base and the covering member, each of the main vias having a straight hole wall;
   a plurality of insulators formed on the straight hole walls of the main vias to form a plurality of main through holes in the plurality of main vias, each of the main through holes having an active region being in communication with at least one of the first side and the second side and disposed on at least one of the base and the covering member, each of the main through holes having a step-shaped hole wall at the active region, wherein the active region is in a shape of two steps and comprises a first hole portion, a second hole portion, and a third hole portion that are in communication in a same sequence, the third hole portion is an outermost one of the hole portions and is in communication with at least one of the first side and the second side, the third hole portion is narrower than the second hole portion, and the second hole portion has a width less than a width of the first hole portion; and
   a plurality of connecting elements disposed in the main through holes and exposed from at least one of the first side and the second side of the body,
   wherein the active region is wider than the connecting element,
   wherein the first hole portion and the second hole portion are free from being in contact with the connecting element, and
   wherein the connecting element extends from the first side to the second side and protrudes from at least one of the first side and the second side.

2. The detection device of claim 1, wherein the base is made of a conductive material.

3. The detection device of claim 1, wherein the covering member is made of a conductive material.

4. The detection device of claim 1, wherein any one of the first hole portion, the second hole portion, and the third hole portion is wider than the connecting elements.

5. The detection device of claim 1, wherein the main vias and the main through holes are coaxially disposed.

6. The detection device of claim 1, wherein the connecting elements are probes.

7. The detection device of claim 1, further comprising a carrier configured for receiving the body.

8. A method for fabricating a detection device, comprising:
   providing a body having a first side, a second side opposing the first side, and a plurality of main vias being in communication with the first side and the second side, each of the main vias having a straight hole wall;
   filling in the main vias an insulation material;
   forming in the insulation material a plurality of main through holes to form a plurality of insulators, the insulation material being on the straight hole walls of the main vias and free from filling the main vias completely and the insulators being composed of the insulation material, each of the main through holes having an active region being in communication with at least one of the first side and the second side of the body, each of the main through holes having a step-shaped hole wall at the active region, wherein the active region is in a shape of two steps and comprises a first hole portion, a second hole portion, and a third hole portion that are in communication in a same sequence, the third hole portion is an outermost one of the hole portions and is in communication with at least one of the first side and the second side, the third hole portion is narrower than the second hole portion, and the second hole portion has a width less than a width of the first hole portion; and
   disposing in the main through holes a plurality of connecting elements exposed from at least one of the first side and the second side of the body,
   wherein the first hole portion and the second hole portion are free from being in contact with the connecting element, and
   wherein the connecting element extends from the first side to the second side and protrudes from at least one of the first side and the second side.

9. The method of claim 8, further comprising:
   providing a base having a first via and a covering member having a second via;
   filling the insulation material in the first via and the second via;
   forming a first through hole in the insulation material of the first via to form a first insulation part composed of the insulation material;
   forming a second through hole in the insulation material of the second via to form a second insulation part composed of the insulation material; and
   stacking the covering member on the base to form the body, communicating the first via with the second via to form the main vias, the main vias penetrating the base and the covering member and connecting the first insulation part and the second insulation part to form the insulator.

10. The method of claim 9, wherein the base is made of a conductive material.

11. The method of claim 9, wherein the covering member is made of a conductive material.

12. The method of claim 9, wherein the active region is disposed on at least one of the base and the covering member.

13. The method of claim 8, wherein any one of the first hole portion, the second hole portion, and the third hole portion is wider than the connecting elements.

14. The method of claim 8, wherein the main vias and the main through holes are coaxially disposed.

15. The method of claim 8, wherein the connecting elements are probes.

16. The method of claim 8, further comprising receiving the body on a carrier.

\* \* \* \* \*